US008760957B2

(12) United States Patent
Lee et al.

(10) Patent No.: US 8,760,957 B2
(45) Date of Patent: Jun. 24, 2014

(54) NON-VOLATILE MEMORY AND METHOD HAVING A MEMORY ARRAY WITH A HIGH-SPEED, SHORT BIT-LINE PORTION

(75) Inventors: Seungpil Lee, San Ramon, CA (US); Jongmin Park, Cupertino, CA (US)

(73) Assignee: Sandisk Technologies, Inc., Plano, TX (US)

( * ) Notice: Subject to any disclaimer, the term of this patent is extended or adjusted under 35 U.S.C. 154(b) by 127 days.

(21) Appl. No.: 13/431,670

(22) Filed: Mar. 27, 2012

(65) Prior Publication Data

US 2013/0258772 A1  Oct. 3, 2013

(51) Int. Cl.
*G11C 8/00* (2006.01)
*G11C 16/04* (2006.01)
*G11C 11/56* (2006.01)

(52) U.S. Cl.
CPC ........ *G11C 16/0483* (2013.01); *G11C 16/0425* (2013.01); *G11C 16/0433* (2013.01); *G11C 11/5621* (2013.01)
USPC .................... 365/230.03; 365/63; 365/189.08

(58) Field of Classification Search
CPC ........... G11C 16/0483; G11C 16/0425; G11C 16/0433
USPC .................................. 365/230.03, 63, 189.08
See application file for complete search history.

(56) References Cited

U.S. PATENT DOCUMENTS

| | | | |
|---|---|---|---|
| 5,070,032 A | 12/1991 | Yuan et al. | |
| 5,095,344 A | 3/1992 | Harari | |
| 5,313,421 A | 5/1994 | Guterman et al. | |
| 5,315,541 A | 5/1994 | Harari et al. | |
| 5,343,063 A | 8/1994 | Yuan et al. | |
| 5,570,315 A | 10/1996 | Tanaka et al. | |
| 5,587,949 A | 12/1996 | Bergemont et al. | |
| 5,661,053 A | 8/1997 | Yuan | |
| 5,768,192 A | 6/1998 | Eitan | |
| 5,903,495 A | 5/1999 | Takeuchi et al. | |
| 5,930,167 A | 7/1999 | Lee et al. | |
| 5,966,326 A | 10/1999 | Park et al. | |
| 6,011,725 A | 1/2000 | Eitan | |
| 6,046,935 A | 4/2000 | Takeuchi et al. | |
| 6,222,762 B1 | 4/2001 | Guterman et al. | |
| 6,532,172 B2 | 3/2003 | Harari et al. | |

(Continued)

OTHER PUBLICATIONS

Eitan et al., "NROM: A Novel Localized Trapping, 2-Bit Nonvolatile Memory Cell," IEEE Electron Device Letters, vol. 21, No. 11, Nov. 2000, pp. 543-545.

(Continued)

*Primary Examiner* — Viet Q Nguyen
(74) *Attorney, Agent, or Firm* — Davis Wright Tremaine LLP

(57) ABSTRACT

A non-volatile memory array is partitioned along the column direction into first and second portions. The first portion has SLC memory cells and the second portion has MLC memory cells. The first portion acts as a fast cache memory for the second portion. The read/write operations of the first portion are further enhanced by coupling to a set of read/write circuits immediately adjacent to the first portion, while the column of each bit line is switchably cut off at the junction between the first and second portions. In this way, the RC constant of the cut off bit line is at a minimum, which translates to faster precharge of the bit line via the read/write circuits. When the second portion is operating, its access to the set of read/write circuits is accomplished by not cutting off each bit line at the junction between the first and second portions.

16 Claims, 8 Drawing Sheets

(56) References Cited

U.S. PATENT DOCUMENTS

| | | |
|---|---|---|
| 6,552,932 B1 | 4/2003 | Cernea |
| 7,313,023 B2 * | 12/2007 | Li et al. .................... 365/185.13 |
| 7,433,246 B2 * | 10/2008 | Lee .......................... 365/189.14 |
| 7,453,712 B2 * | 11/2008 | Kim et al. ....................... 365/63 |
| 7,542,340 B2 * | 6/2009 | Fisch et al. ............... 365/185.05 |
| 7,583,533 B2 * | 9/2009 | Kutsukake et al. ...... 365/185.17 |
| 7,630,252 B2 * | 12/2009 | Lin .......................... 365/185.24 |
| 7,698,615 B2 * | 4/2010 | Kang et al. ..................... 714/746 |
| 7,916,534 B2 * | 3/2011 | Shimizu et al. .......... 365/185.03 |
| 8,026,544 B2 * | 9/2011 | Ito et al. ........................ 257/321 |
| 8,060,719 B2 * | 11/2011 | Radke et al. .................. 711/165 |
| 8,270,214 B2 * | 9/2012 | Shibata et al. ........... 365/185.03 |
| 8,281,061 B2 * | 10/2012 | Radke et al. ................... 711/103 |
| 8,363,468 B2 * | 1/2013 | Shimizu et al. .......... 365/185.03 |
| 2002/0085405 A1 | 7/2002 | Muller et al. |
| 2010/0172180 A1 | 7/2010 | Paley et al. |

OTHER PUBLICATIONS

Notification of Transmittal of the International Search Report and the Written Opinion of the International Searching Authority, or the Declaration for Int'l Application No. PCT/US2013/029374 mailed on Jul. 9, 2013, 8 pages.

\* cited by examiner

Conventional Array Architecture

Conventional Array Architecture

Programming into two states represented by a 1-bit code

MEMORY ARRAY 200'

Second Array Portion 420
(slower but higher density storage)

320 — MLC BLOCK ← D3

Folding

Switch Boundary 414

First Array Portion 410
(faster and but lower density storage)

310 —
SLC BLOCK 3
SLC BLOCK 2  } D1
SLC BLOCK 1

Read/Write Circuits 204

*FIG. 7*

NON-VOLATILE MEMORY AND METHOD HAVING A MEMORY ARRAY WITH A HIGH-SPEED, SHORT BIT-LINE PORTION

FIELD OF THE INVENTION

This application relates to the operation of re-programmable non-volatile memory systems such as semiconductor flash memory, and, more specifically, to a flash memory having an enhanced performing write cache.

BACKGROUND OF THE INVENTION

This application relates to the operation of re-programmable non-volatile memory systems such as semiconductor flash memory, and, more specifically, to ones having a high-speed, lower density memory portion operating as cache to a higher density memory portion.

Solid-state memory capable of nonvolatile storage of charge, particularly in the form of EEPROM and flash EEPROM packaged as a small form factor card, has recently become the storage of choice in a variety of mobile and handheld devices, notably information appliances and consumer electronics products. Unlike RAM (random access memory) that is also solid-state memory, flash memory is non-volatile, and retaining its stored data even after power is turned off. Also, unlike ROM (read only memory), flash memory is rewritable similar to a disk storage device. In spite of the higher cost, flash memory is increasingly being used in mass storage applications. Conventional mass storage, based on rotating magnetic medium such as hard drives and floppy disks, is unsuitable for the mobile and handheld environment. This is because disk drives tend to be bulky, are prone to mechanical failure and have high latency and high power requirements. These undesirable attributes make disk-based storage impractical in most mobile and portable applications. On the other hand, flash memory, both embedded and in the form of a removable card are ideally suited in the mobile and handheld environment because of its small size, low power consumption, high speed and high reliability features.

Flash EEPROM is similar to EEPROM (electrically erasable and programmable read-only memory) in that it is a non-volatile memory that can be erased and have new data written or "programmed" into their memory cells. Both utilize a floating (unconnected) conductive gate, in a field effect transistor structure, positioned over a channel region in a semiconductor substrate, between source and drain regions. A control gate is then provided over the floating gate. The threshold voltage characteristic of the transistor is controlled by the amount of charge that is retained on the floating gate. That is, for a given level of charge on the floating gate, there is a corresponding voltage (threshold) that must be applied to the control gate before the transistor is turned "on" to permit conduction between its source and drain regions. In particular, flash memory such as Flash EEPROM allows entire blocks of memory cells to be erased at the same time.

The floating gate can hold a range of charges and therefore can be programmed to any threshold voltage level within a threshold voltage window. The size of the threshold voltage window is delimited by the minimum and maximum threshold levels of the device, which in turn correspond to the range of the charges that can be programmed onto the floating gate. The threshold window generally depends on the memory device's characteristics, operating conditions and history. Each distinct, resolvable threshold voltage level range within the window may, in principle, be used to designate a definite memory state of the cell.

It is common in current commercial products for each storage element of a flash EEPROM array to store a single bit of data by operating in a binary mode, where two ranges of threshold levels of the storage element transistors are defined as storage levels. The threshold levels of transistors correspond to ranges of charge levels stored on their storage elements. In addition to shrinking the size of the memory arrays, the trend is to further increase the density of data storage of such memory arrays by storing more than one bit of data in each storage element transistor. This is accomplished by defining more than two threshold levels as storage states for each storage element transistor, four such states (2 bits of data per storage element) now being included in commercial products. More storage states, such as 16 states per storage element, are also being implemented. Each storage element memory transistor has a certain total range (window) of threshold voltages in which it may practically be operated, and that range is divided into the number of states defined for it plus margins between the states to allow for them to be clearly differentiated from one another. Obviously, the more bits a memory cell is configured to store, the smaller is the margin of error it has to operate in.

The transistor serving as a memory cell is typically programmed to a "programmed" state by one of two mechanisms. In "hot electron injection," a high voltage applied to the drain accelerates electrons across the substrate channel region. At the same time a high voltage applied to the control gate pulls the hot electrons through a thin gate dielectric onto the floating gate. In "tunneling injection," a high voltage is applied to the control gate relative to the substrate. In this way, electrons are pulled from the substrate to the intervening floating gate. While the term "program" has been used historically to describe writing to a memory by injecting electrons to an initially erased charge storage unit of the memory cell so as to alter the memory state, it has now been used interchangeable with more common terms such as "write" or "record."

The memory device may be erased by a number of mechanisms. For EEPROM, a memory cell is electrically erasable, by applying a high voltage to the substrate relative to the control gate so as to induce electrons in the floating gate to tunnel through a thin oxide to the substrate channel region (i.e., Fowler-Nordheim tunneling.) Typically, the EEPROM is erasable byte by byte. For flash EEPROM, the memory is electrically erasable either all at once or one or more minimum erasable blocks at a time, where a minimum erasable block may consist of one or more sectors and each sector may store 512 bytes or more of data.

The memory device typically comprises one or more memory chips that may be mounted on a card. Each memory chip comprises an array of memory cells supported by peripheral circuits such as decoders and erase, write and read circuits. The more sophisticated memory devices also come with a controller that performs intelligent and higher level memory operations and interfacing.

There are many commercially successful non-volatile solid-state memory devices being used today. These memory devices may be flash EEPROM or may employ other types of nonvolatile memory cells. Examples of flash memory and systems and methods of manufacturing them are given in U.S. Pat. Nos. 5,070,032, 5,095,344, 5,315,541, 5,343,063, and 5,661,053, 5,313,421 and 6,222,762. In particular, flash memory devices with NAND string structures are described in U.S. Pat. Nos. 5,570,315, 5,903,495, 6,046,935. Also non-volatile memory devices are also manufactured from memory cells with a dielectric layer for storing charge. Instead of the conductive floating gate elements described earlier, a dielectric layer is used. Such memory devices utilizing dielectric storage element have been described by Eitan et al., "NROM: A Novel Localized Trapping, 2-Bit Nonvolatile Memory Cell," IEEE Electron Device Letters, vol. 21, no. 11, November 2000, pp. 543-545. An ONO dielectric layer extends across the channel between source and drain diffusions. The charge for one data bit is localized in the dielectric layer adjacent to the drain, and the charge for the other data bit is localized in the dielectric layer adjacent to the source. For example, U.S. Pat. Nos. 5,768,192 and 6,011,725 disclose a nonvolatile memory cell having a trapping dielectric sandwiched between two silicon dioxide layers. Multi-state data storage is implemented by separately reading the binary states of the spatially separated charge storage regions within the dielectric.

A memory array of solid-state memory cells is typically organized into rows and columns and addressable by word lines and bit lines respectively. In practice, a page of memory cells along a row is accessed by a common word line together with a page of corresponding bit lines in parallel. The page of corresponding bit lines is coupled to a corresponding page of read/write circuits.

In a memory operation, such as read, write or erase, the individual word lines and bit lines of the array will need to be set to predetermined voltages for the operation to take place. As the bit lines and word lines behave like a RC circuit, they will take time to charge up to the predetermined voltages in what is referred to as a precharge operation. The precharge time is proportional to the RC constant of the individual line.

As the memory chip becomes more and more dense with higher and higher integration, the conductive wires forming the bit lines and word lines become thinner and more resistive. This causes wire RC delay in a bit line or word line to become increasing significant and increases the precharge time, thereby impacting performance.

Various solutions have been implemented by segmenting the bit lines or word lines to reduce the RC delay in each segment. For example, U.S. Pat. No. 5,315,541, U.S. Pat. No. 6,532,172 and U.S. Pat. No. 6,552,932 disclose a bit line can be individually isolated into many shorter segments and each segment can be selectively coupled to a precharge source or a read/writing circuit via a low resistive rail. However, selectively switching a segment of the array to a low resistive rail incurs additional circuits and metal lines, as well as introducing the RC delay of the metal lines into the segmented bit line.

The trend is to reduce the size of the memory systems in order to be able to put more memory cells in the system and to make the system as small as possible to fit in smaller host devices. Memory capacity is increased by a combination of higher integration of circuits and configuring each memory cell to store more bits of data. In the latter case, the memory cell is configured as MLC ("multi-level cell") that is able to store more than one bit of data. However MLC cells take longer to program and sense compared to SLC ("single-level cell") cells that store one bit of data per cell.

U.S. Pat. No. 5,930,167 discloses a memory having its memory array partitioned into an MLC (multi-level cell) portion and a SLC (single-level cell) portion. The MLC portion is able to store data more densely and the SLC portion is able to store data more quickly and more robustly. The partition into the MLC portion and SLC portion of the array is typically logical in that a physical page of the memory array may be allocated either as an MLC page of a SLC page dynamically depending on various criteria such as use history, error rates of the pages.

A preferred operational scheme is to have the SLC portion serving as a write cache. A host can write data quickly into the SLC portion of the memory device. Later, the data in the SLC portion is transferred to the MLC portion.

Thus, there is a need to provide a nonvolatile memory with a high performance write cache portion.

SUMMARY AND OBJECTS OF THE INVENTION

According to a general implementation of the invention, a non-volatile memory device has a memory array accessible by rows of word lines and columns of bit lines. The memory array is partitioned along the column direction into first and second portions. The first portion has SLC memory cells located to one end of the memory array and the second portion has MLC memory cells constitutes the remaining portion of the memory array. The first portion acts as a fast cache memory for the second portion. The read/write operations of the first portion are further enhanced by coupling to a set of read/write circuits immediately adjacent to the first portion, while the column of each bit line is switchably cut off at the junction between the first and second portions. In this way, the RC constant of the cut off bit line is at a minimum, which translates to faster precharge of the bit line via the read/write circuits. On the other hand, when the second portion is operating, its access to the set of read/write circuits is accomplished by not cutting off each bit line at the junction between the first and second portions.

Additional objects, features and advantages of the present invention will be understood from the following description of its preferred embodiments, which description should be taken in conjunction with the accompanying drawings.

BRIEF DESCRIPTION OF THE DRAWINGS

FIG. 7 illustrates the caching of the data into the SLC portion and then the subsequent archiving of the cached data to the MLC portion.

DESCRIPTION OF THE PREFERRED EMBODIMENTS

Memory System

Figure 1:
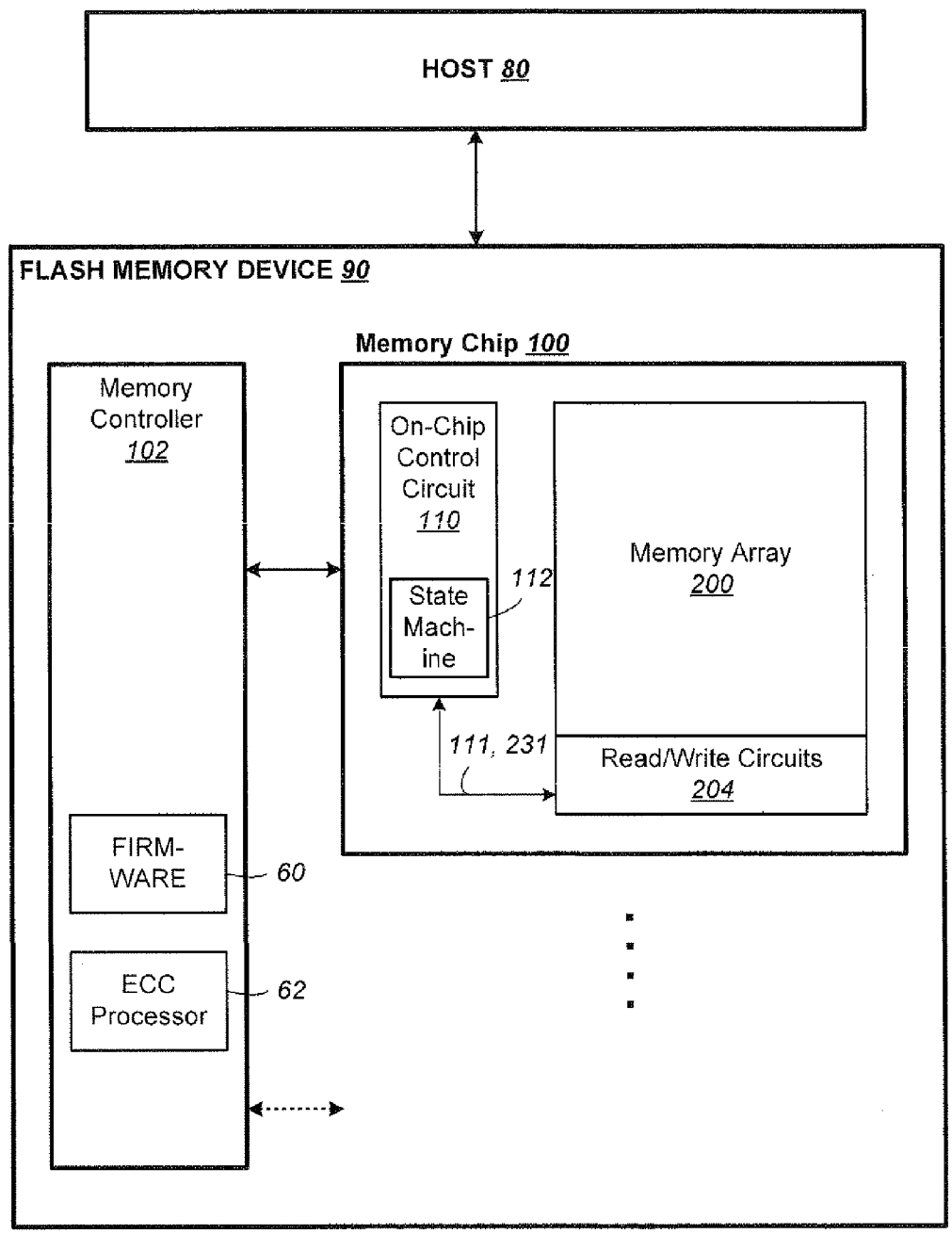
FIG. 1 illustrates a host in communication with a memory device in which the features of the present invention are embodied.

FIG. 1 illustrates a host in communication with a memory device in which the features of the present invention are embodied. The host 80 typically sends data to be stored at the memory device 90 or retrieves data by reading the memory device 90. The memory device 90 includes one or more memory chip 100 managed by a memory controller 102. The memory chip 100 includes a memory array 200 of memory cells with each cell capable of being configured as a multi-level cell ("MLC") for storing multiple bits of data, as well as capable of being configured as a single-level cell ("SLC") for storing 1 bit of data. The memory chip also includes read/write circuits 204 such as row and column decoders, sense modules, data latches and I/O circuits. An on-chip control circuitry 110 controls low-level memory operations of each chip. The control circuitry 110 is an on-chip controller that cooperates with the read/write circuits to perform memory operations on the memory array 200. The control circuitry 110 typically includes a state machine 112 to provide chip level control of memory operations via a data bus 231 and control and address bus 111.

In many implementations, the host 80 communicates and interacts with the memory chip 100 via the memory controller 102. The controller 102 cooperates with the memory chip and controls and manages higher level memory operations. A firmware 60 provides codes to implement the functions of the controller 102. An error correction code ("ECC") processor 62 processes ECC during operations of the memory device.

For example, in a host write, the host 10 sends data to be written to the memory array 100 in logical sectors allocated from a file system of the host's operating system. A memory block management system implemented in the controller stages the sectors and maps and stores them to the physical structure of the memory array. A preferred block management system is disclosed in United States Patent Application Publication Number: US-2010-0172180-A1, the entire disclosure of which is incorporated herein by reference.

Physical Memory Architecture

In order to improve read and program performance, multiple charge storage elements or memory transistors in an array are read or programmed in parallel. Thus, a "page" of memory elements are read or programmed together. In existing memory architectures, a row typically contains several interleaved pages or it may constitute one page. All memory elements of a page will be read or programmed together.

Figure 2:
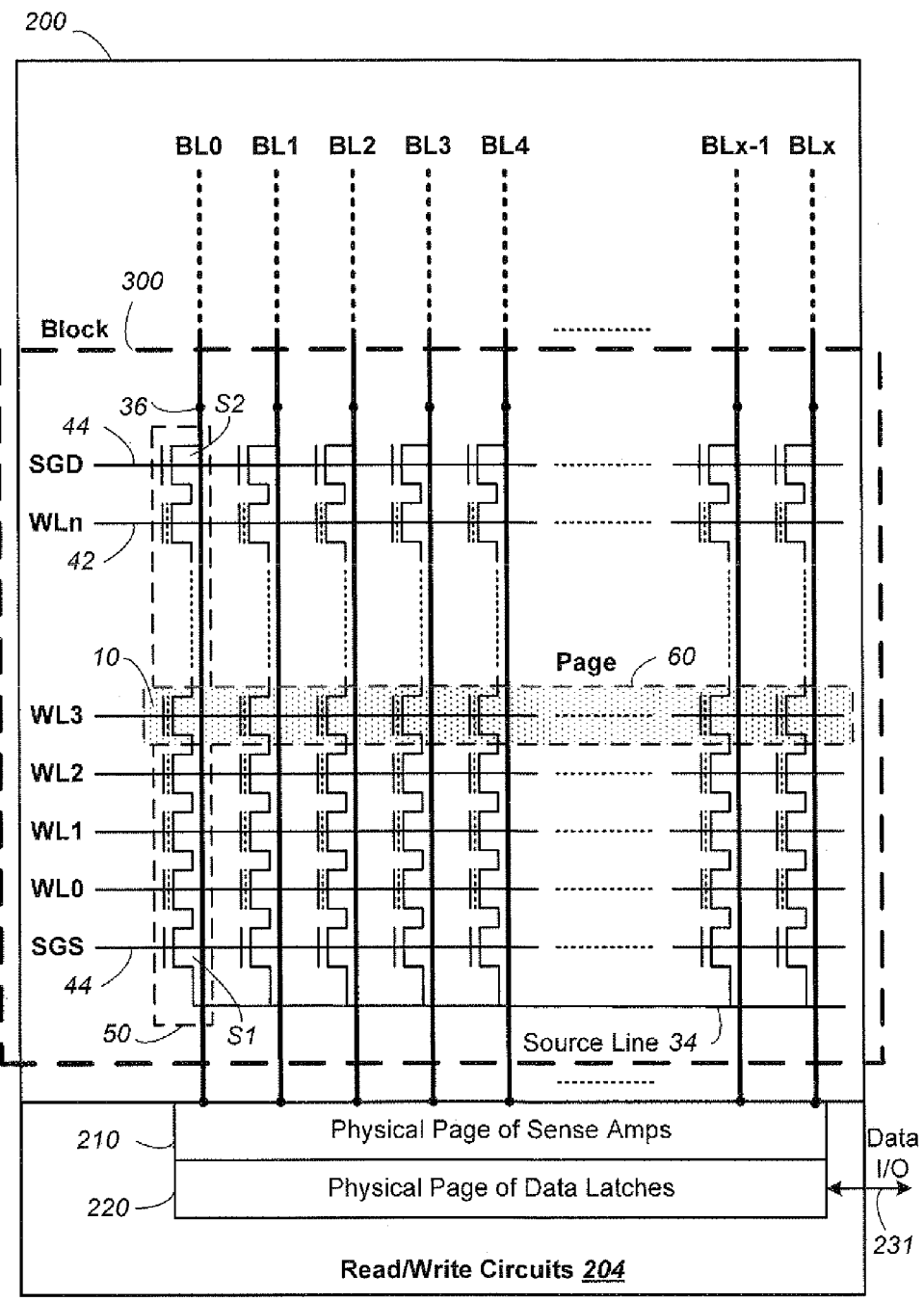
FIG. 2 illustrates a page of memory cells, organized for example in the NAND configuration, being sensed or programmed in parallel.

FIG. 2 illustrates a page of memory cells, organized for example in the NAND configuration, being sensed or programmed in parallel. FIG. 2 essentially shows a bank of NAND strings 50 in the memory array 200 of FIG. 1. A "page" such as the page 60, is a group of memory cells enabled to be sensed or programmed in parallel. This is accomplished in the read/write circuits 204 by a corresponding page of sense amplifiers 210. The sensed results are latches in a corresponding set of data latches 220. Each sense amplifier can be coupled to a NAND string, such as NAND string 50 via a bit line 36. For example, the page 60 is along a row and is sensed by a sensing voltage applied to the control gates of the cells of the page connected in common to the word line WL3. Along each column, each cell such as cell 10 is accessible by a sense amplifier via a bit line 36. Data in the data latches 220 are toggled in from or out to the memory controller 102 via a data I/O bus 231.

The page referred to above is a physical page memory cells or sense amplifiers. Depending on context, in the case where each cell is storing multi-bit data, each physical page has multiple data pages.

The NAND string 50 is a series of memory transistors 10 daisy-chained by their sources and drains to form a source terminal and a drain terminal respective at its two ends. A pair of select transistors S1, S2 controls the memory transistors chain's connection to the external via the NAND string's source terminal and drain terminal respectively. In a memory array, when the source select transistor S1 is turned on, the source terminal is coupled to a source line 34. Similarly, when the drain select transistor S2 is turned on, the drain terminal of the NAND string is coupled to a bit line 36 of the memory array. Each memory transistor 10 in the chain acts as a memory cell. It has a charge storage element 20 to store a given amount of charge so as to represent an intended memory state. A control gate of each memory transistor allows control over read and write operations. The control gates of corresponding memory transistors of a row of NAND string are all connected to the same word line (such as WL0, WL1, . . . ) Similarly, a control gate of each of the select transistors S1, S2 (accessed via select lines SGS and SOD respectively) provides control access to the NAND string via its source terminal and drain terminal respectively.

Erase Blocks

One important difference between flash memory and other type of memory is that a cell must be programmed from the erased state. That is the floating gate must first be emptied of charge. Programming then adds a desired amount of charge back to the floating gate. It does not support removing a portion of the charge from the floating to go from a more programmed state to a lesser one. This means that update data cannot overwrite existing one and must be written to a previous unwritten location.

Furthermore erasing is to empty all the charges from the floating gate and generally takes appreciably time. For that reason, it will be cumbersome and very slow to erase cell by cell or even page by page. In practice, the array of memory cells is divided into a large number of blocks of memory cells. As is common for flash EEPROM systems, the block is the unit of erase. That is, each block contains the minimum number of memory cells that are erased together.

Figure 3:
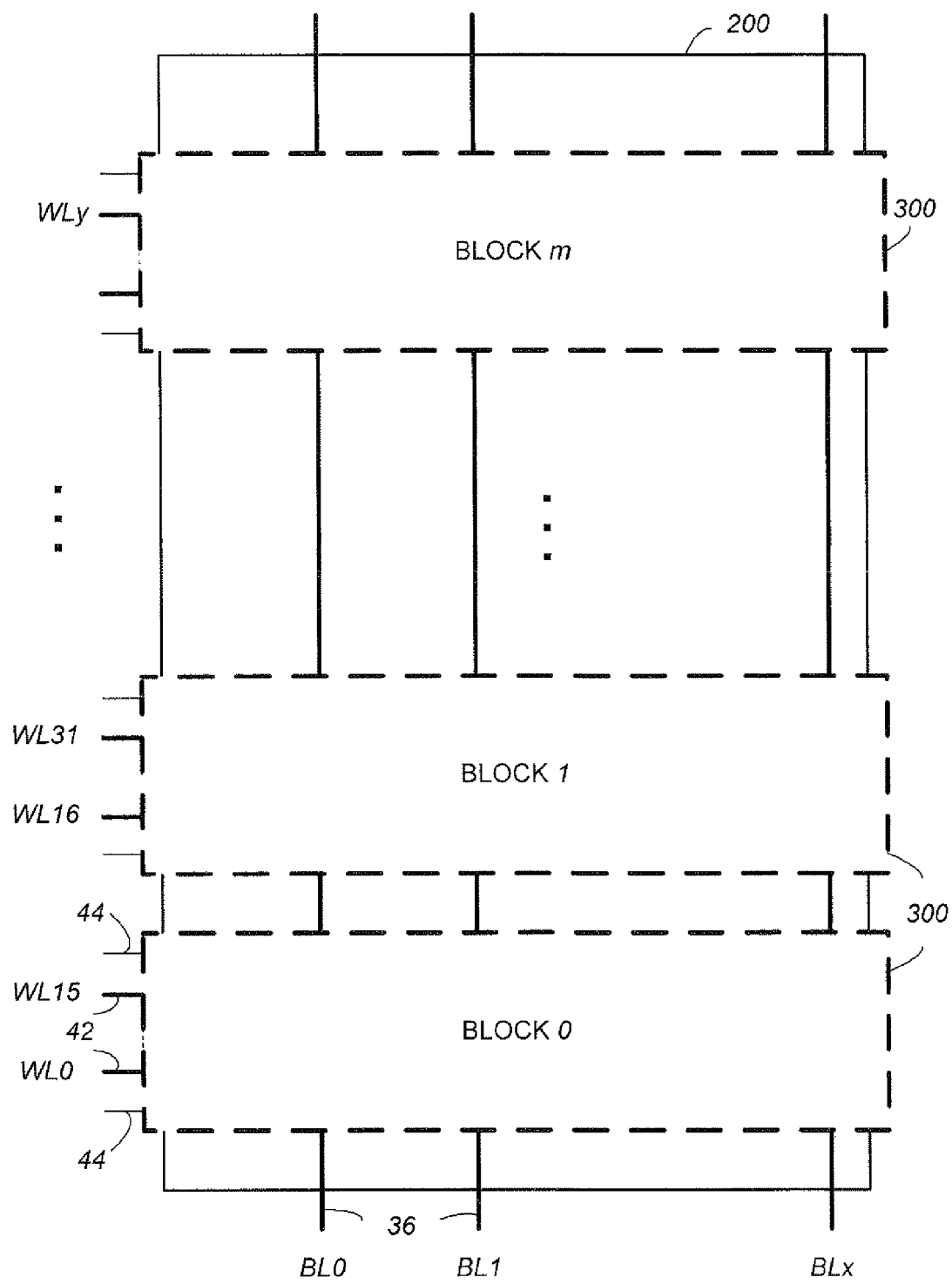
FIG. 3 illustrates schematically an example of a memory array organized into erasable blocks.

FIG. 3 illustrates schematically an example of a memory array organized in erasable blocks. Programming of charge storage memory devices can only result in adding more charge to its charge storage elements. Therefore, prior to a program operation, existing charge in charge storage element of a memory cell must be removed (or erased). A non-volatile memory such as EEPROM is referred to as a "Flash" EEPROM when an entire array of cells 200, or significant groups of cells of the array, is electrically erased together (i.e., in a flash). Once erased, the group of cells can then be reprogrammed. The group of cells erasable together may consist of one or more addressable erase unit 300. The erase unit or block 300 typically stores one or more pages of data, the page being a minimum unit of programming and reading, although more than one page may be programmed or read in a single operation. Each page typically stores one or more sectors of data, the size of the sector being defined by the host system. An example is a sector of 512 bytes of user data, following a standard established with magnetic disk drives, plus some number of bytes of overhead information about the user data and/or the block in with it is stored.

In the example shown in FIG. 3, individual memory cells in the memory array 200 are accessible by word lines 42 such as WL0-WLy and bit lines 36 such as BL0-BLx. The memory is organized into erase blocks, such as erase blocks 0; 1, . . . m. If the NAND string 50 (see FIG. 2) contains 16 memory cells, then the first bank of NAND strings in the array will be accessible by select lines 44 and word lines 42 such as WL0 to WL15. The erase block 0 is organized to have all the memory cells of the first bank of NAND strings erased together. In memory architecture, more than one bank of NAND strings may be erased together.

Examples of Binary (SLC) and Multi-Level (MLC) Memory Cells

As described earlier, an example of nonvolatile memory is formed from an array of field-effect transistors, each having a charge storage layer between its channel region and its control gate. The charge storage layer or unit can store a range of charges, giving rise to a range of threshold voltages for each field-effect transistor. The range of possible threshold voltages spans a threshold window. When the threshold window is partitioned into multiple sub-ranges or zones of threshold voltages, each resolvable zone is used to represent a different memory states for a memory cell. The multiple memory states can be coded by one or more binary bits.

Figure 4:
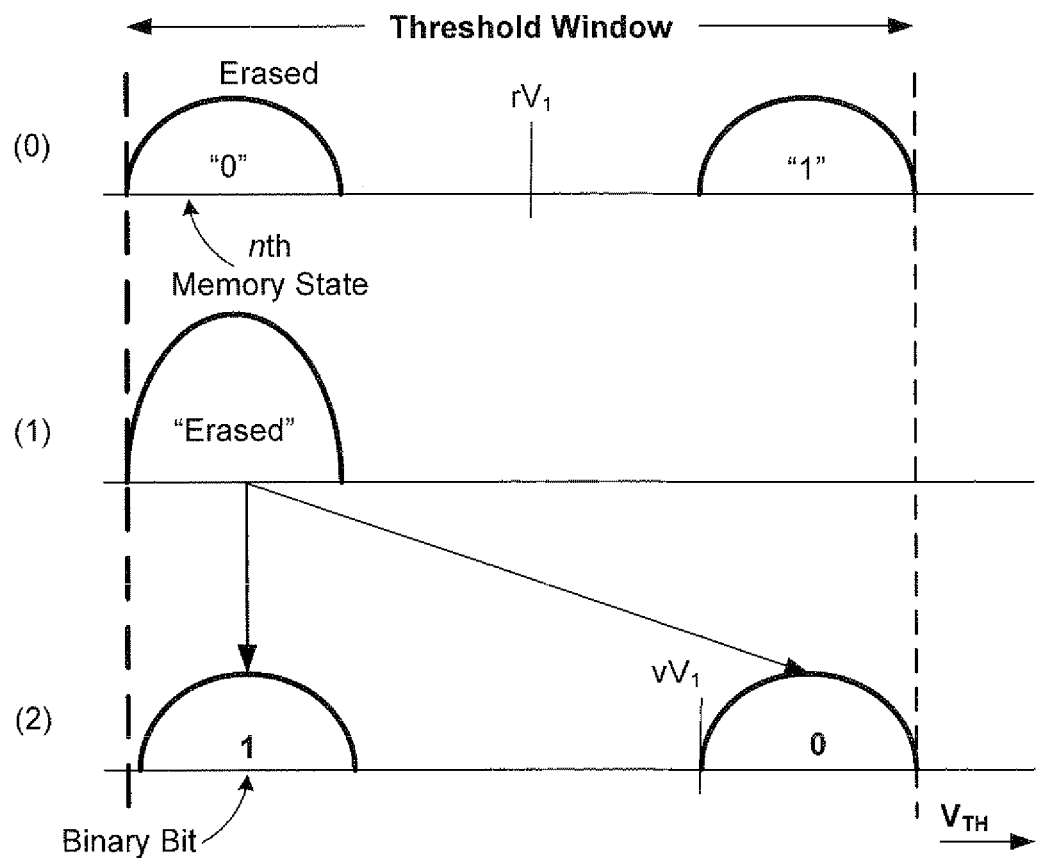
FIG. 4 illustrates programming of 1-bit SLC memory cells.

FIG. 4 illustrates a binary memory having a population of cells with each cell being in one of two possible states. Each memory cell has its threshold window partitioned by a single demarcation level into two distinct zones. As shown in FIG. 4(0), during read, a read demarcation level $rV_1$, between a lower zone and an upper zone, is used to determine to which zone the threshold level of the cell lies. The cell is in an "erased" state if its threshold is located in the lower zone and is in a "programmed" state if its threshold is located in the upper zone. FIG. 4(1) illustrates the memory initially has all its cells in the "erased" state. FIG. 4(2) illustrates some of cells being programmed to the "programmed" state. A 1-bit or binary code is used to code the memory states. For example, the bit value "1" represents the "erased" state and "0" represents the "programmed" state. Typically programming is performed by application of one or more programming voltage pulse. After each pulse, the cell is sensed to verify if the threshold has moved beyond a verify demarcation level $vV_1$. A memory with such memory cell partitioning is referred to as "binary" memory or Single-level Cell ("SLC") memory. It will be seen that a binary or SLC memory operates with a wide margin of error as the entire threshold window is only occupied by two zones.

Figure 5:
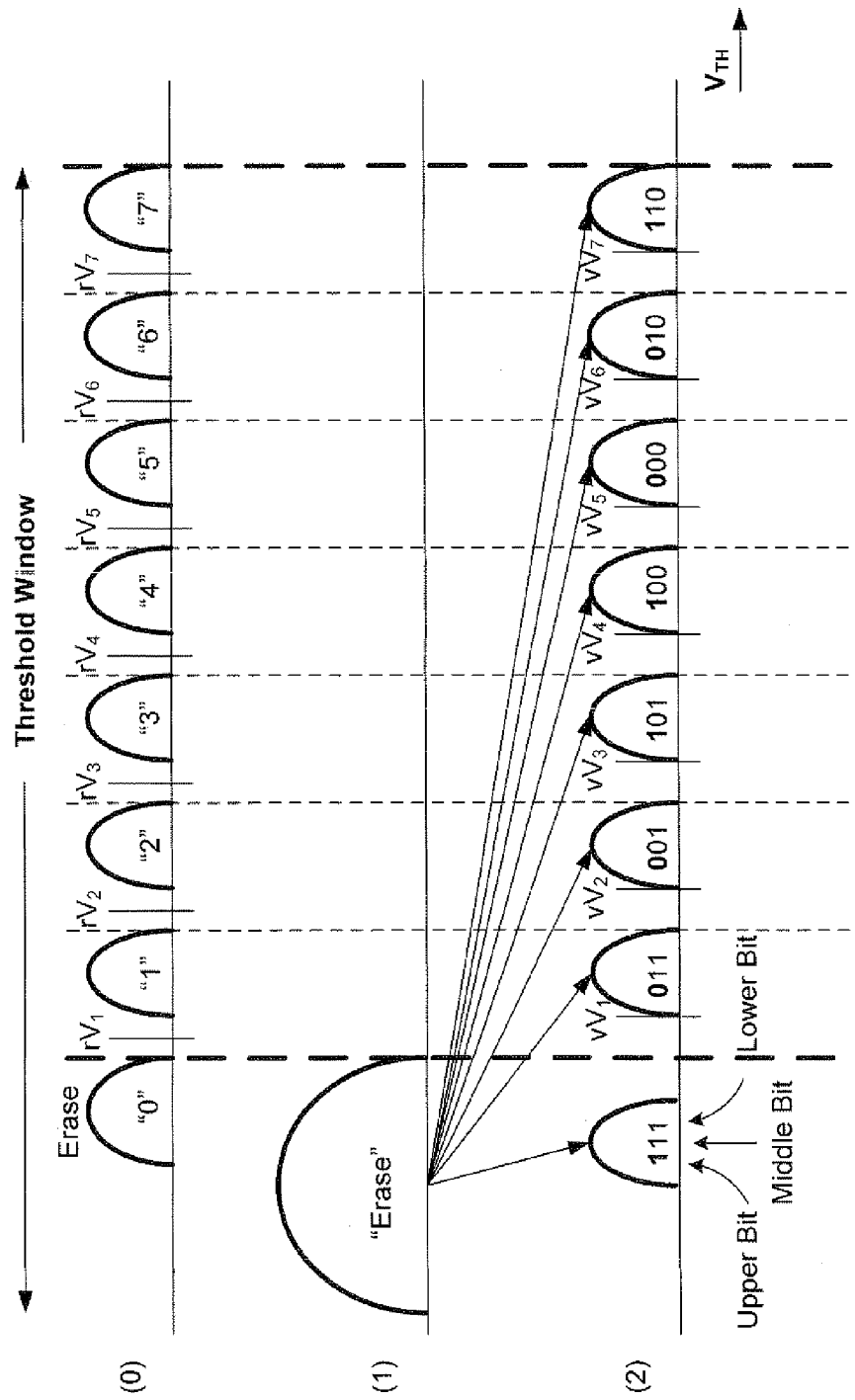
FIG. 5 illustrates programming of 3-bit MLC memory cells.

FIG. 5 illustrates a multi-state memory having a population of cells with each cell being in one of eight possible states. Each memory cell has its threshold window partitioned by at least seven demarcation levels into eight distinct zones. As shown in FIG. 5(0), during read, read demarcation levels $rV_1$ to $rV_7$ are used to determine to which zone the threshold level of the cell lies. The cell is in an "erased" state if its threshold is located in the lowest zone and is in one of multiple "programmed" states if its threshold is located in the upper zones. FIG. 5(1) illustrates the memory initially has all its cells in the "erased" state. FIG. 5(2) illustrates some of cells being programmed to the "programmed" state. A 3-bit code having lower, middle and upper bits can be used to represent each of the eight memory states. For example, the "0", "1", "2", "3", "4", "5", "6" and "7" states are respectively represented by "111", "011", "001", "101', "100", "000", "010" and '110". Typically programming is performed by application of one or more programming voltage pulses. After each pulse, the cell is sensed to verify if the threshold has moved beyond a reference which is one of verify demarcation levels $vV_1$ to $vV_7$. A memory with such memory cell partitioning is referred to as "multi-state" memory or Multi-level Cell ("MLC") memory. In a number programming method employs multiple programming passes before the cells are programmed to their target states in order to alleviate floating-gate to floating-gate perturbations.

Similarly, a memory storing 4-bit code will have lower, first middle, second middle and upper bits, representing each of the sixteen states. The threshold window will be demarcated by at least 15 demarcation levels into sixteen distinct zones.

As the memory's finite threshold window is partitioned into more regions, the resolution for programming and reading will necessarily become finer. Thus, a multi-state or MLC memory necessarily operates with a narrower margin of error compared to that of a memory with less partitioned zones. In other words, the error rate increases with the number of bits stored in each cell. In general, error rate increases with the number of partitioned zones in the threshold window.

Owning to the number of memory states to differentiate, MLC memory take longer to read and write compared to SLC memory.

As mentioned earlier, U.S. Pat. No. 5,930,167 discloses a memory having its memory array partitioned into an MLC (multi-level cell) portion and a SLC (single-level cell) portion. The MLC portion is able to store data more densely and the SLC portion is able to store data more quickly and more robustly. The partition into the MLC portion and SLC portion of the array is typically logical in that a physical page of the memory array may be allocated either as an MLC page of a SLC page dynamically depending on various criteria such as use history, error rates of the pages.

A preferred operational scheme is to have the SLC portion serving as a write cache. A host can write data quickly into the SLC portion of the memory device. Later, the data in the SLC portion is transferred to the MLC portion.

Having the faster SLC portion serving as a write cache for the slower MLC portion helps to improve write performance when a host writes to the memory device.

Memory Array with a Write Cache Portion and Having Shortened Bit Lines

According to a general implementation of the invention, a non-volatile memory device has a memory array accessible by rows of word lines and columns of bit lines. The memory array is partitioned along the column direction into first and second portions. The first portion has SLC memory cells located to one end of the memory array and the second portion has MLC memory cells constitutes the remaining portion of the memory array. The first portion acts as a fast cache memory for the second portion. The read/write operations of the first portion are further enhanced by coupling to a set of read/write circuits immediately adjacent to the first portion, while the column of each bit line is switchably cut off at the junction between the first and second portions. In this way, the RC constant of the cut off bit line is at a minimum, which translates to faster precharge of the bit line via the read/write circuits. On the other hand, when the second portion is operating, its access to the set of read/write circuits is accomplished by not cutting off each bit line at the junction between the first and second portions.

Figure 6:
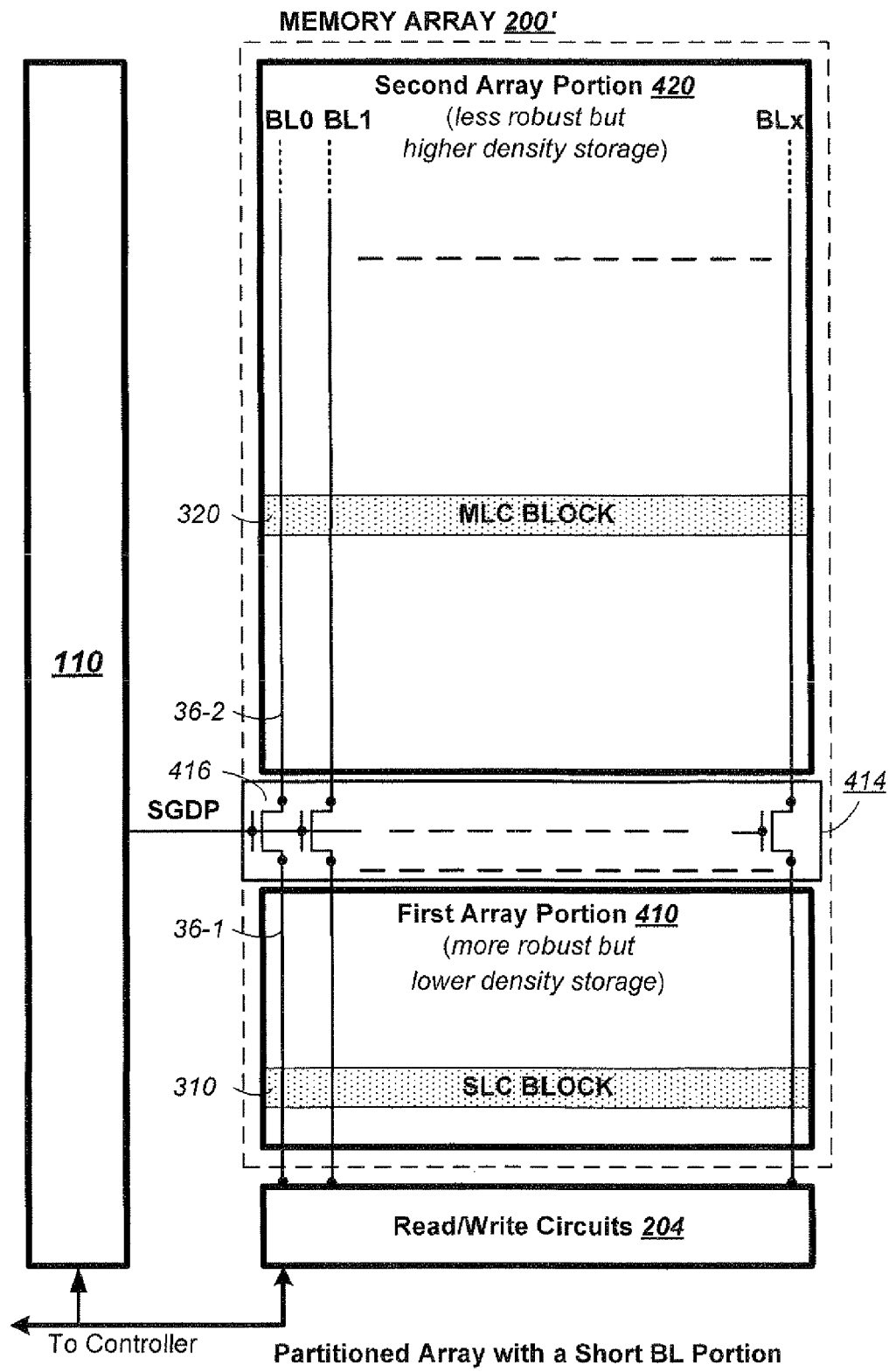
FIG. 6 illustrates a memory according to a preferred embodiment of the invention.

FIG. 6 illustrates a memory according to a preferred embodiment of the invention. The array of memory cells 200' is partitioned into a first array portion 410 and a second array portion 420. The second array portion 420 has the memory cells configured as MLC memory cells for high density storage with each cell storing multiple bits of data. The first array portion 410 has the memory cells configured for lower density storage with each cell storing one bit or less number of bits than that of the second portion. For example, memory cells in the first array portion 410 are configured as SLC memory to store 1 bit of data each and memory cells in the second portion 420 are configured as MLC memory to store 3 bits of data each. The first array portion storing 1 bit of data per cell will also be referred as D1 and the second array portion storing 3 bit of data per cell as D3. In view of the discussion earlier, the first array portion will operate with less memory states to distinguish and a much wider margin of error compared to that of the second array portion. Thus, memory operations in the first array portion will be faster than those in the second array portion.

The partitioning of the memory array 200' is physical in that the first array portion 410 is located closest to the read/write circuits 204 compared to the second array portion 420. For example if the memory array 200' has rows 1 to y, the first array portion 410 occupies rows 1 to y/4 and the second array portion 420 occupies rows y/4+1 to y, then the read/write circuits 204 is located adjacent to row 1 of the first array portion 410.

One feature of the memory array 200' is that the bit lines running along the column direction are each partitioned into two segments along the boundary 414 between the first array portion 410 and the second array portion 420. For example, the first array portion 410 has the bit line segments 36-1 and the second array portion 420 has the bit line segments 36-2.

The first array portion 410 has first ends of the bit line segments 36-1 coupled to the read/write circuits 204. It also has second ends of the bit line segments 36-1 arranged in switchable connection with corresponding first ends of the bit line segments 36-2 of the second array portion 420. At the boundary 414, the switching at each column between the second end of the bit line segment 36-1 and the first end of the bit line segment 36-2 is effected by a switch 416. Responsive to a control signal SGDP from the on-chip control circuit 110, the switch 416 either connects or disconnects the two bit line segments from the two array portions. Since a page of memory cells is being accessed in parallel via a corresponding page of bit lines BL0 to BLx, there will be a corresponding bank of switches 416 all controlled by the signal SGDP.

As described earlier, the memory array 200' is organized into erase blocks and each erase block contains a number of pages and the memory cells in each page are read or programmed in parallel. Thus, the first array portion 410 will have memory cells configured to operate as SLC memory and have SLC blocks 310. Similarly, the second array portion 420 will have memory cells configured to operate as MLC memory and have MLC blocks 320.

When memory operations such as read or programming are performed on MLC memory cells in the second array portion 420, the on-chip control circuit 110 asserts the signal SGDP which effectively turns on the bank of switches 416 and connects the bit line segments 36-2 of the second array portion 410 to the bit line segments 36-1 of the first array portion 410. In this way the second array portion can be accessed by the read/write circuits 204 through the joined bit line segments.

When memory operations such as read or programming are performed on SLC memory cells in the first array portion 410, the on-chip control circuit 110 de-asserts the signal SGDP which effectively turns off the bank of switches 416 and isolates the first array portion 410 from the second array portion 420. In this way the RC value of the bit line segment 36-1 of the first array portion is minimized.

The resistance, R, of a segment of bit line is proportional to the length of the segment. Similarly, the capacitance, C, of a segment is proportional to the length of the segment. Thus, the product of RC for a segment of the bit line is a function of the square of the length of the segment.

The response is a charging up of a portion of the bit line with time constant given by RC. The charged up voltage at time t is $VBL(t)=VBL*[1-EXP(-t/RC)]$. The discharged voltage at time t is $VBL(t) VBL*EXP(-t/RC)$. In other word, the product RC is a time constant that determines the rate of charging or discharging of the bit line. After one unit of time constant, the bit line will be charged to 63.2 percent. After two units of time constant, the bit line will be charged to 86.5 percent, etc.

In a memory operation, such as read, write or erase, the individual word lines and bit lines of the array will need to be set to predetermined voltages for the operation to take place. As the bit lines and word lines behave like a RC circuit, they will take time to charge up to the predetermined voltages in what is referred to as a precharge operation. The precharge time is proportional to the RC constant of the individual line.

Thus, the greater the RC, the slower will the charging and discharging be. For example, if the bit line length is cut in half, the RC constant will be reduced by 4 times and the charging and discharging rate of the bit line will be similarly reduced. In another example, the memory array 200' is partitioned with the length of the bit line segments 36-1 of the first array portion 410 in a ratio of 1:4 to the bit line segments 36-2 of the second array portion 420. This reduces the RC constant by a factor of 16.

Owning to the reduced RC in the bit line, when operated with isolated bit line segments 36-1, the SLC memory cells of the first array portion 410 will be able to be read and programmed at enhanced speeds since the time to charge and discharge the bit line segments are reduced.

On-Chip Block-Copying from First Array Portion to Second Array Portion

The higher speed first array portion 410 is advantageously used as a write cache for incoming host write data. The cached data is eventually written to the slower speed second array portion 420.

FIG. 7 illustrates the caching of the data into the SLC portion and then the subsequent archiving of the cached data to the MLC portion.

In Step (1), during a host write, input data is first cached in the first array portion 410. It is written page by page and block by block directly into the first array portion 410. For example, SLC blocks 1-3 are written in the D1 memory.

In Step (2), the data in the SLC blocks 1-3 are copied (or folded) to a single MLC block of D3 memory in the second array portion 420. The folding operation is performed by the memory as controlled by firmware 60 in the controller 102 (see FIG. 1). The operation is preferably conducted in the foreground in a spare period when a host command is operating.

In this way, the host data can be written quickly into the first portion and later archived into higher density MLC storage in the second portion. The write performance of the first portion is further enhanced by isolating the first portion from the second portion so as to be able to operate with short bit lines.

A memory configured with D1 and D3 portion is also disclosed in U.S. application Ser. No. 12/642,584 filed on Dec. 18, 2009, the entire disclosure of which is incorporated herein by reference.

Figure 8:
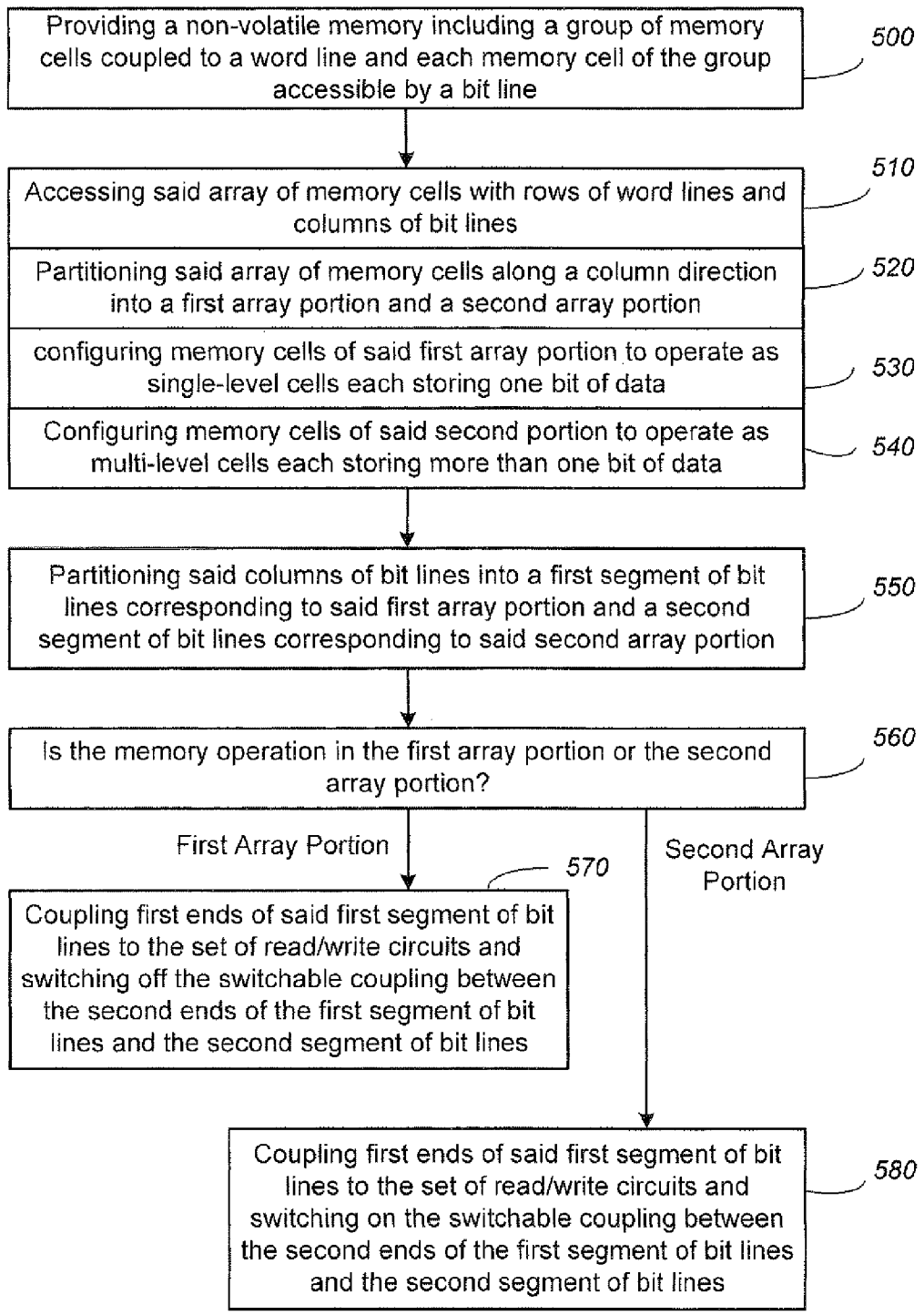
FIG. 8 is a flow diagram illustrating the multiple pass programming with the improved LM pass, according to the first embodiment.

FIG. 8 is a flow diagram illustrating a method of operating the memory device, according to a general technique of the invention.

STEP 500: Providing a non-volatile memory including a group of memory cells coupled to a word line and each memory cell of the group accessible by a bit line.

STEP 510: Accessing said array of memory cells with rows of word lines and columns of bit lines;

STEP 520: Partitioning said array of memory cells along a column direction into a first array portion and a second array portion;

STEP 530: Configuring memory cells of said first array portion to operate as single-level cells each storing one bit of data;

STEP 540: Configuring memory cells of said second portion to operate as multi-level cells each storing more than one bit of data;

STEP 550: Partitioning said columns of bit lines into a first segment of bit lines corresponding to said first array portion and a second segment of bit lines corresponding to said second array portion;

STEP 560: Providing a switchable couplings between the second ends of the first segment of bit lines and the second segment of bit lines;

STEP 570: Is the memory operation in the first array portion or the second array portion? If in the first array portion, go to STEP 580. If in the second array portion go to STEP 590.

STEP 580: Coupling first ends of said first segment of bit lines to the set of read/write circuits and switching off the switchable coupling between the second ends of the first segment of bit lines and the second segment of bit lines when reading and writing in parallel a group of memory cells of the first array portion; and STEP 590: Coupling first ends of said first segment of bit lines to the set of read/write circuits and switching on the switchable coupling between the second ends of the first segment of bit lines and the second segment of bit lines when reading and writing in parallel a group of memory cells of the second array portion.

While the embodiments of this invention that have been described are the preferred implementations, those skilled in the art will understand that variations thereof may also be possible. Therefore, the invention is entitled to protection within the full scope of the appended claims.

What is claimed is:

1. A non-volatile memory device, comprising:
an array of memory cells;
rows of word lines and columns of bit lines for accessing said array of memory cells;
said array of memory cells being partitioned along a column direction into a first array portion and a second array portion;
said first array portion having memory cells configured as single-level cells each storing one bit of data;
said second portion having memory cells configured as multi-level cells each storing more than one bit of data;
a set of switches one for each bit line;
said columns of bit lines being partitioned by said set of switches into a first segment of bit lines corresponding to said first array portion and, a second segment of bit lines corresponding to said second array portion;
said first segment of bit lines having first and second ends;
said first ends being coupled adjacent to a set of read/write circuits for reading and writing in parallel a group of memory cells of said array; and
said second ends being switchably connected to said second segment of bit lines via said set of switches for said second segment of bit lines to access said set of read/write circuits via said first segment of bit lines.

2. A non-volatile memory device as in claim 1, further comprising:
a control circuit responsive to operations in said first array portion for switching off said set of switches to eliminate effect of said second segment of bit lines on said first segment of bit lines.

3. A non-volatile memory device as in claim 1, further comprising:
a control circuit responsive to operations in said second array portion for switching on said set of switches to provide coupling of said second segment of bit lines to said set of read/write circuits via said first segment of bit lines.

4. A non-volatile memory device as in claim 1, wherein:
said first segment of bit lines and said second segment of bit lines respectively have lengths in a ratio of less than or equal to 1:1.

5. A non-volatile memory device as in claim 1, wherein:
said first segment of bit lines and said second segment of bit lines respectively have RC constants in a ratio of less than or equal to 1:4.

6. A non-volatile memory device as in claim 1, wherein:
said first array portion acts as a cache storage of data received from a host.

7. A non-volatile memory device as in claim 6, wherein:
data cached in said first array portion is eventually transferred to said second array portion.

8. A non-volatile memory device as in claim 1, wherein:
said array of memory cells is of the NAND type.

9. A method of operating, a non-volatile memory device having an array of memory cells, comprising:
accessing said array of memory cells with rows of word lines and columns of bit lines;
partitioning said array of memory cells along a column direction into a first array portion and a second array portion, said first array portion being adjacent a set of read/write circuit;
configuring memory cells of said first array portion to operate as single-level cells each storing one bit of data;
configuring memory cells of said second portion to operate as multi-level cells each storing more than one bit of data;
providing a set of switches, one for each bit line;
partitioning said columns of bit lines by said set of switches into a first segment of bit lines corresponding to said first array portion and a second segment of bit lines corresponding to said second array portion;
said first segment of bit lines having first ends adjacent the set of read/write circuits and second ends adjacent the second segment of bit lines;
coupling first ends of said first segment of bit lines to the set of read/write circuits;
switching off the set of switches to isolate the first segment of bit lines from the second segment of bit lines when reading and writing in parallel a group of memory cells of the first array portion; and
switching on the set of switches to connect the first segment of bit lines to the second segment of bit lines when reading and writing in parallel a group of memory cells of the second array portion.

10. The method as in claim 9, further comprising:
responsive to operations in said first array portion, decoupling said second segment of bit lines from said second ends of said first segment of bit lines to eliminate effect of said second segment of bit lines on said first segment of bit lines.

11. The method as in claim 9, further comprising:
responsive to operations in said second array portion, coupling said second segment of bit lines to said second ends of said first segment of bit lines to access said set of read/write circuits.

12. The method as in claim 9, wherein:
said first segment of bit lines and said second segment of bit lines respectively have lengths in a ratio of less than or equal to 1:1.

13. The method as in claim 9, wherein:
said first segment of bit lines and said second segment of bit lines respectively have RC constants in a ratio of less than or equal to 1:4.

14. The method as in claim 9, wherein:
said first array portion acts as a cache storage of data received from a host.

15. The method as in claim 14, wherein:
data cached in said first array portion is eventually transferred to said second array portion.

16. The method as in claim 9, wherein:
said array of memory cells is of the NAND type.

* * * * *